(12) United States Patent
Oda

(10) Patent No.: US 7,892,367 B2
(45) Date of Patent: Feb. 22, 2011

(54) TANTALUM SPUTTERING TARGET

(75) Inventor: Kunihiro Oda, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 588 days.

(21) Appl. No.: 10/572,252

(22) PCT Filed: Oct. 20, 2004

(86) PCT No.: PCT/JP2004/015473

§ 371 (c)(1), (2), (4) Date: Mar. 17, 2006

(87) PCT Pub. No.: WO2005/045090

PCT Pub. Date: May 19, 2005

(65) Prior Publication Data

US 2007/0023281 A1 Feb. 1, 2007

(30) Foreign Application Priority Data

Nov. 6, 2003 (JP) ............................. 2003-376380

(51) Int. Cl.
C22C 27/02 (2006.01)
C23C 14/00 (2006.01)
(52) U.S. Cl. .............. 148/422; 204/298.12; 204/298.13
(58) Field of Classification Search ................. 148/422; 204/298.12, 298.13
See application file for complete search history.

(56) References Cited

U.S. PATENT DOCUMENTS

| | | |
|---|---|---|
| 4,994,118 A | 2/1991 | Pircher et al. |
| 6,193,821 B1 | 2/2001 | Zhang |
| 6,197,134 B1 | 3/2001 | Kanzaki et al. |
| 6,323,055 B1 | 11/2001 | Rosenberg et al. |
| 6,331,233 B1 | 12/2001 | Turner |
| 6,348,113 B1 | 2/2002 | Michaluk et al. |
| 6,348,139 B1 | 2/2002 | Shah et al. |
| 6,759,143 B2 | 7/2004 | Oda et al. |
| 6,770,154 B2 * | 8/2004 | Koenigsmann et al. ...... 148/422 |
| 6,893,513 B2 | 5/2005 | Michaluk et al. |
| 7,156,963 B2 | 1/2007 | Oda |
| 2002/0063056 A1 | 5/2002 | Shah et al. |
| 2005/0155856 A1 | 7/2005 | Oda |
| 2005/0268999 A1 | 12/2005 | Oda |
| 2007/0062806 A1 | 3/2007 | Oda |
| 2007/0062807 A1 | 3/2007 | Oda |
| 2007/0102288 A1 | 5/2007 | Oda et al. |

FOREIGN PATENT DOCUMENTS

| | | |
|---|---|---|
| EP | 0902102 A1 | 3/1999 |
| JP | 2000-355761 A | 12/2000 |

OTHER PUBLICATIONS

Esp@cenet database, One Page English Abstract of JP 2002-363736, Dec. 18, 2002.
Esp@cenet database, One Page English Abstract of JP 2000-323433, Nov. 24, 2000.
Esp@cenet database, One Page English Abstract of JP 2000-323434, Nov. 24, 2000.
Esp@cenet database, One Page English Abstract of JP 2004-027358, Jan. 29, 2004.
English Abstract of JP 2001-271161 A, Oct. 2, 2001.
English Abstract of JP 01-215426 A, Aug. 29, 1989.
English Abstract of JP 2000-239835 A, Sep. 5, 2000.
English Abstract of JP 61-124566 A, Jun. 12, 1986.
English Abstract of JP 09-104972 A, Apr. 22, 1997.
English Abstract of JP 2002-363662 A, Dec. 18, 2002.
English Abstract of JP 06-264232 A, Sep. 20, 1994.
Michaluk et al., "Tantalum 101: Economics and Technology of Ta Materials", Semiconductor International, pp. 271-278, Jul. 2000.
Unpublished Co-pending U.S. Appl. No. 11/912,450.

* cited by examiner

Primary Examiner—Roy King
Assistant Examiner—Caitlin Fogarty
(74) Attorney, Agent, or Firm—Howson & Howson LLP

(57) ABSTRACT

A tantalum sputtering target, wherein when the sum of the overall crystalline orientation is 1 on a tantalum target surface, the area ratio of crystals having any orientation among (100), (111), (110) does not exceed 0.5. Thus, obtained is a tantalum sputtering target having superior deposition properties where the deposition speed is high, film evenness (uniformity) is superior, and generation of arcings or particles is reduced.

16 Claims, 2 Drawing Sheets

TANTALUM SPUTTERING TARGET

BACKGROUND OF THE INVENTION

The present invention relates to a tantalum sputtering target having a random crystalline orientation, high deposition speed, superior film evenness (uniformity), reduced generation of arcings or particles and favorable target use efficiency.

In recent years, the sputtering method for forming a film from materials such as metal or ceramics has been used in numerous fields such as electronics, corrosion resistant materials and ornaments, catalysts, as well as in the manufacture of cutting/grinding materials and abrasion resistant materials.

Although the sputtering method itself is a well-known method in the foregoing fields, recently, particularly in the electronics field, a tantalum sputtering target suitable for forming films of complex shapes and forming circuits is in demand.

Generally, this tantalum target is manufactured by forging and annealing (heat treatment) an ingot or billet formed by performing electron beam melting and casting to a tantalum material, and thereafter performing rolling and finish processing (mechanical processing, polishing, etc.) thereto.

In this kind of manufacturing procedure, the tantalum sputtering target is manufactured in such a way that the cast structure of the ingot or billet will destroy by the hot forging, disperse or eliminate the pores and segregations, and, by further annealing this, recrystallization will occur, and the precision and strength of the structure can be improved.

Generally speaking, a molten and cast ingot or billet has a crystal grain diameter of 50 mm or more. And, as a result of subjecting this ingot or billet to hot forging and recrystallization annealing, the cast structure will be destroyed, and a generally uniform and fine (100 µm or less) crystal grains can be obtained.

Meanwhile, when sputtering is performed with a target manufactured as described above, it is said that the recrystallization structure of the target will become more fine and uniform, and uniform deposition will become possible with targets having a crystal orientation arranged in a specific direction, and a film with reduced generation of arcings and particles, and having stable properties can be obtained.

Thus, in the manufacturing process of the target, measures for making the recrystallization structure fine and uniform, and arranging the crystal orientation in a specific direction are being adopted (e.g., refer to Patent Documents 1 and 2).

When observing the mechanism of recrystallization, generally speaking, a recrystallized structure is an aggregate of individual crystals with respectively different plane orientations, and each crystal is divided by a grain boundary. Before rearrangement occurs, the strain added to the object via plastic working such as cold rolling is absorbed in the primary crystals by the transgranular slip in a certain direction, and the strain is accumulated therein.

Such strained primary crystals take on a network cell structure that is extremely fine with slightly different orientations aggregated with lattice defects such as transition, and are also separated into a plurality of different areas with significantly differing orientations. When this kind of deformation structure is heated, the cells change into subgrains (recovery process) through the combination of transition or rearrangement. The change from a cell into a subgrain hardly involves any change in the measurement.

And, it is considered that these subgrains are combined, and a specific subgrain grows to become a recrystallized core, corrodes the non-recrystallized portion, grows and promotes the recrystallization.

With a tantalum target, it is said that a target having a fully recrystallized structure based on full annealing, and, as described above, having a specific crystal orientation is favorable in stabilizing the structure.

When sputtering is performed with a tantalum target as described above, there are problems in that the evenness (uniformity) of the film will become inferior, the generation of arcings and particles will be promoted, and the quality of sputtering deposition will deteriorate.

[Patent Document 1] PCT(WO)2002-518593

[Patent Document 2] U.S. Pat. No. 6,331,233

SUMMARY OF THE INVENTION

Thus, an object of the present invention is to obtain a tantalum sputtering target having superior deposition properties where the deposition speed is high, film evenness (uniformity) is superior, and generation of arcings or particles is reduced in comparison to a conventional tantalum target with an arrangement with a specific crystal orientation.

In order to overcome the foregoing problems, the present inventors discovered that a tantalum sputtering target having superior deposition properties in comparison to conventional tantalum targets can be obtained by improving and devising the target structure and randomizing the crystal orientation.

Based on the foregoing discovery, the present invention provides: 1) a tantalum sputtering target, wherein when the sum of the overall crystalline orientation is 1 on a tantalum target surface, the area ratio of crystals having any orientation among (100), (111) and (110) does not exceed 0.5; 2) a tantalum sputtering target, wherein when the sum of the overall crystalline orientation is 1 on a tantalum target surface, the sum of the area ratio of crystals having any two orientations among (100), (111) and (110) does not exceed 0.75; 3) the tantalum sputtering target according to 1) above, wherein when the sum of the overall crystalline orientation is 1 on a tantalum target surface, the sum of the area ratio of crystals having any two orientations among (100), (111) and (110) does not exceed 0.75; and 4) the tantalum sputtering target according to any one of 1) to 3) above, wherein the tantalum target surface is a sputtered erosion face.

The present invention also provides: 5) a tantalum sputtering target, wherein when the sum of the overall crystalline orientation is 1 on a tantalum target surface, the area ratio of crystals having any orientation among (100)<001>, (111) <001> and (110)<001> and in which the rotation error is within 10° against an ND axis (orientation axis normal to rolling plane) does not exceed 0.5; 6) a tantalum sputtering target, wherein when the sum of the overall crystalline orientation is 1 on a tantalum target surface, the sum of the area ratio of crystals having any two orientations among (100) <001>, (111)<001> and (110)<001> and in which the rotation error is within 10° against an ND axis (orientation axis normal to rolling plane) does not exceed 0.75; 7) the tantalum sputtering target according to 5) above, wherein when the sum of the overall crystalline orientation is 1 on a tantalum target surface, the sum of the area ratio of crystals having any two orientations among (100)<001>, (111)<001> and (110) <001> and in which the rotation error is within 10° against an ND axis (orientation axis normal to rolling plane) does not exceed 0.75; and 8) the tantalum sputtering target according to any one of 5) to 7) above, wherein the tantalum target surface is a sputtered erosion face.

The present invention also provides: 9) a tantalum sputtering target, wherein when the strength is measured with the complete randomness of the crystal orientation being 1 in a pole figure based on EBSP measuring the (100) orientation on a tantalum target surface, a strength of 1 or more is represented with a scale divided into 6 parts, and the θ in the pole figure has a peak having a strength of 1 or more not only in the 0° or 90° direction, but also in a direction therebetween; and 10) the tantalum sputtering target according to any one of 1) to 9) above, wherein when the strength is measured with the complete randomness of the crystal orientation being 1 in a pole figure based on EBSP measuring the (100) orientation on a tantalum target surface, a strength of 1 or more is represented with a scale divided into 6 parts, and the θ in the pole figure has a peak having a strength of 1 or more not only in the 0° or 90° direction, but also in a direction therebetween.

The present invention also provides: 11) a tantalum sputtering target, wherein when the strength is measured with the complete randomness of the crystal orientation being 1 in a pole figure based on EBSP measuring the (100) orientation on a tantalum target surface, a strength of 1 or more is represented with a scale divided into 6 parts, and the portion shown with a peak having a strength of 1 or more appearing outside the ND direction (0°) in the pole figure has a spread of 20° or more; 12) the tantalum sputtering target according to any one of 1) to 9) above, wherein when the strength is measured with the complete randomness of the crystal orientation being 1 in a pole figure based on EBSP measuring the (100) orientation on a tantalum target surface, a strength of 1 or more is represented with a scale divided into 6 parts, and the portion shown with a peak having a strength of 1 or more appearing outside the ND direction (0°) in the pole figure has a spread of 20° or more; 13) the [tantalum sputtering] target according to any one of 1) to 12) above, wherein the average crystal grain size of the target is 80 μm or less; 14) the [tantalum sputtering] target according to any one of 1) to 13) above, wherein the target has a fine structure based on a roll-processed structure, and when the target surface is analyzed with EBSP, crystal grains having a crystal grain size of 25 to 150 μm exist in an amount of 100 to 1000 crystal grains/mm$^2$; 15) the tantalum sputtering target according to 14) above, wherein the tantalum target surface is a sputtered erosion face; and 16) the target according to any one of 1) to 15) above, wherein the purity of the target is 99.99% or more.

The present invention yields a superior effect in that it is able to provide a tantalum sputtering target having superior deposition properties where the deposition speed is high, film evenness (uniformity) is superior, generation of arcings or particles is reduced and the use efficiency of the target is favorable in comparison to a conventional tantalum target with a crystal orientation arranged on the target surface.

DETAILED DESCRIPTION OF THE INVENTION

Figure 1:
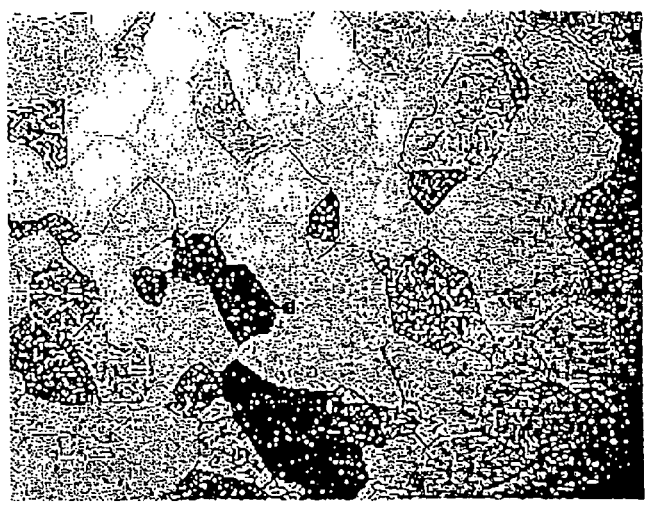
FIG. 1 is a micrograph (magnification×100) showing the tantalum target obtained by performing the cold finishing processing and recrystallization annealing of the present invention.

The sputtering target of the present invention having a random crystal orientation is generally manufactured with the following process.

To exemplify a specific example, foremost, a tantalum raw material (usually, high purity tantalum of 4N (99.99%) or more is used) is melted via electronic beam melting or the like, and this is cast to prepare an ingot or billet. Next, this ingot or billet is subject to a series of processing steps including annealing—forging, rolling, annealing (heat treatment), finish processing and so on.

Specifically, for instance, the foregoing ingot is subject to annealing (first time) at a temperature of 1373K to 1673K—cold forging (first time)—recrystallization annealing (second time) at a temperature between the recrystallization starting temperature and 1373K—cold forging (second time)—recrystallization annealing (third time) at a temperature between the recrystallization starting temperature and 1373K—cold (hot) rolling (first time)—recrystallization annealing at a temperature between the recrystallization starting temperature and 1373K (fourth time)—cold (hot) rolling (second time as required)—recrystallization annealing at a temperature between the recrystallization starting temperature and 1373K (fifth time as required)—finish processing to form a target material.

The forging or rolling performed to the ingot or billet will destroy the cast structure, disperse or eliminate the pores and segregations, and, by further annealing this, recrystallization will occur, and the precision and strength of the structure can be improved to a certain degree.

In the foregoing process, although the recrystallization annealing may be performed only once, by repeating this twice, the structural defects can be effectively reduced. Further, cold (hot) rolling and recrystallization annealing at a temperature between the recrystallization starting temperature and 1373K may be repeated or may be performed for one cycle. Thereafter, this is ultimately finished in a target shape via finish processing such as machining or polishing.

Although the tantalum target is manufactured with the foregoing manufacturing process, what is particularly important in the present invention is that the crystal orientation is made random as possible without arranging such crystal orientation of the target in a specific direction. Therefore, although a preferable example of the manufacturing process was described above, the present invention is not limited to the foregoing manufacturing process so as long as the manufacturing process is able to achieve the random crystal orientation of the present invention.

During the series of processes, it is necessary to destroy the cast structure with forging and rolling, and to sufficiently perform recrystallization. In the present invention also, after performing the processes of forging and rolling to the molten and cast tantalum ingot or billet, it is desirable to perform recrystallization annealing at a temperature between the recrystallization starting temperature and 1673K so as to make the structure fine and uniform. In other words, prior to the final process, the improvement of material characteristics is sought by making the structure fine and uniform pursuant to the recrystallization similar to conventional methods.

In the present invention, it is desirable to perform annealing at a temperature of 1273K or less after the final plastic working process such as rolling. When performing such annealing, there is an effect of alleviating the warping or deformation of the target. This is thereafter subject to finish processing (machining or the like) so as to form a target shape.

The structure of the tantalum target obtained thereby will have a recrystallization structure based on a roll-processed structure, and the crystal orientation will become random. In other words, obtained is a tantalum sputtering target, wherein, when the sum of the overall crystalline orientation is 1 on a tantalum target surface, the area ratio of crystals having any orientation among (100), (111) and (110) will not exceed 0.5. When the area ratio exceeds 0.5, a specific crystal orientation will become preferential, and the object of the present invention cannot be achieved.

Further, with the present invention, when the sum of the overall crystalline orientation is 1 on a tantalum target surface, it is desirable that the sum of the area ratio of crystals having any two orientations among (100), (111) and (110) does not exceed 0.75. This is also a favorable condition for randomizing the crystal orientation.

With this kind of tantalum target surface, it is desirable that the sputtered erosion face, in addition to the face prior to being subject to sputtering, comprises the foregoing condition of a random crystal orientation, and this is required in order to sufficiently achieve the object and effect of the present invention.

The present invention is desirably a tantalum sputtering target, wherein, when the sum of the overall crystalline orientation is 1 on a tantalum target surface, the area ratio of crystals having any orientation among (100)<001>, (111)<001> and (110)<001> and in which the rotation error is within 10° against an ND directional axis (rolled face normal directional axis) does not exceed 0.5.

Similarly, the present invention is also desirably a tantalum sputtering target, wherein when the sum of the overall crystalline orientation is 1 on a tantalum target surface, the sum of the area ratio of crystals having any two orientations among (100)<001>, (111)<001> and (110)<001> and in which the rotation error is within 10° against an ND axis (orientation axis normal to rolling plane) does not exceed 0.75.

A tantalum sputtering target, wherein when the sum of the overall crystalline orientation is 1 on a tantalum target surface, the sum of the area ratio of a crystal having any two orientations among (100)<001>, (111)<001> and (110)<001> and in which the rotation error is within 10° against an ND axis (orientation axis normal to rolling plane) does not exceed 0.75, and the tantalum target surface being a sputtered erosion face are also desirable conditions for achieving the object and effect of the present invention of randomizing the crystal orientation of the target.

The present invention is also desirably a tantalum sputtering target, wherein when the strength is measured with the complete randomness of the crystal orientation being 1 in a pole figure based on EBSP measuring the (100) orientation on a tantalum target surface, a strength of 1 or more is represented with a scale divided into 6 parts, and the θ in the pole figure has a peak having a strength of 1 or more not only in the 0° or 90° direction, but also in a direction therebetween. As a result, the random orientation can be further controlled.

As further desirable conditions of the present invention, the average crystal grain size of the target is 80 μm or less, and the target has a fine structure based on a roll-processed structure; when the target surface is analyzed with EBSP, crystal grains having a crystal grain size of 25 to 150 μm exist in an amount of 100 to 1000 crystal grains/mm$^2$; and the purity of the target is 99.99% or more. The conditions of making the crystal grains smaller and randomizing the crystal orientation will yield the effect of improving the uniformity of sputtering.

Figure 2:
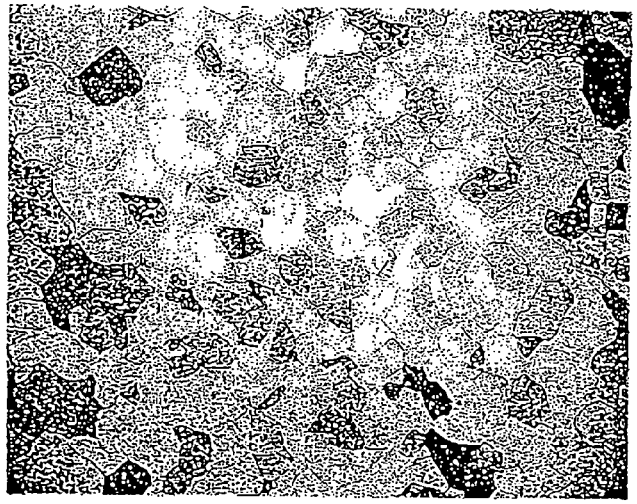
FIG. 2 is a micrograph (magnification×50) showing the tantalum target obtained by performing the cold finishing processing and recrystallization annealing of the present invention.

The structure of the tantalum target according to the present invention (annealed at 1173K) is shown in FIG. 1 (magnification×100) and FIG. 2 (magnification×50).

Figure 3:
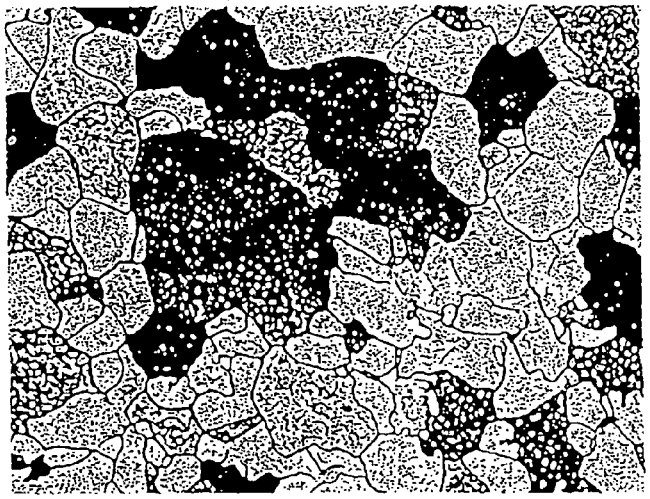
FIG. 3 is a micrograph (magnification×100) showing the tantalum target obtained by performing conventional forging and recrystallization annealing.
Figure 4:
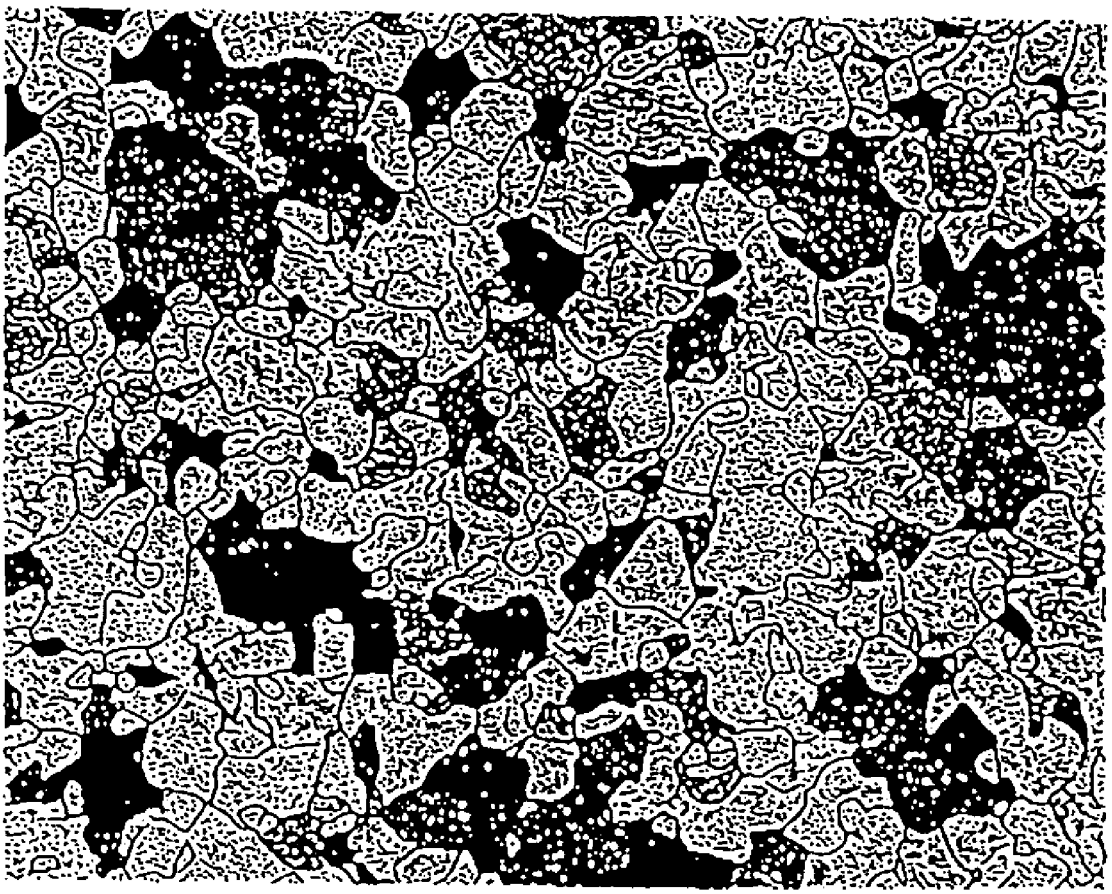
FIG. 4 is a micrograph (magnification×50) showing the tantalum target obtained by performing conventional forging and recrystallization annealing.

Further, a conventional recrystallized structure (subject to recrystallization annealing at 1373K) is shown in FIG. 3 (magnification×100) and FIG. 4 (magnification×50). As shown in the drawings, the structure of the tantalum target according to the present invention is clearly different from the conventional recrystallized structure.

Further, a target finished with plastic working such as rolling without being subject to annealing generates strain due to the heat from the sputtering operation depending on the processing conditions, and warping (bending) or cracks may occur. In the present invention, however, such strain will not be generated.

Moreover, this target material will have a Vickers hardness of 90 or more, Vickers hardness of 100 or more, or Vickers hardness of 125 or more, and a target superior in strength can be obtained.

What is most important in the present invention is to aim for a more random crystal orientation via rolling and recrystallization annealing, and to provide such random crystal orientation of the present invention not only to the target surface, but also to the erosion face appearing in the sputtered face at the stage where erosion is progressing.

This kind of target structure has a significant effect in improving the uniformity. Since this kind of structure can be realized merely by changing the final heat treatment process, it is applicable to any improved versions heretofore and there will be no increase of costs.

The present invention is now explained in detail with reference to the Examples. These Examples are merely illustrative, and the present invention shall in no way be limited thereby. In other words, the present invention shall only be limited by the scope of claim for a patent, and shall include the various modifications other than the Examples of this invention.

Example 1

A tantalum raw material having a purity of 99.997% was subject to electron beam melting, and this was cast to prepare an ingot or billet having a thickness of 200 mm and diameter of 200 mm φ. The crystal grain diameter in this case was approximately 55 mm.

Next, after performing extend forging to this ingot or billet at room temperature, this was subject to recrystallization annealing at a temperature of 1500K. As a result, a material having a structure in which the average crystal grain diameter is 200 μm, thickness of 100 mm, and diameter of 100 mm φ was obtained.

Next, this was subject to extend forging and upset forging at room temperature once again, and recrystallization annealing was performed thereto again at a temperature of 1480K. As a result, a material having a structure in which the average crystal grain diameter is 100 μm, thickness of 100 mm, and diameter of 100 mm φ was obtained.

Next, this was subject to cold extend forging and upset forging, and recrystallization annealing at 1173K, subsequently subject to cold rolling once again, and annealing at 1173K (900° C.) thereafter as well as finish processing, so as to obtain a target material having a thickness of 10 mm and diameter of 320 mm φ.

As a result of performing the foregoing process, it was possible to obtain a tantalum sputtering target having a random orientation wherein, when the sum of the overall crystalline orientation is 1 on a tantalum target surface, the areas ratio of orientations of (100), (111) and (110) are 0.5, 0.4 and 0.1, respectively. Further, this target had a structure where the sputtered erosion face described later also had a similar orientation.

The average crystal grain size of the target was 40 μm, and, when the target surface was analyzed with EBSP, crystal grains having a crystal grain size of 30 to 100 μm existed in an amount of 100 to 1000 crystal grains/mm$^2$.

Incidentally, since the sheet resistance depends on the film thickness, distribution of the sheet resistance within the wafer (8 inch) was measured, and the status of film thickness distribution was examined thereby.

Specifically, the sheet resistance at 49 points on the wafer was measured, and the standard deviation (σ) was calculated. The results are shown in Table 1.

As evident from Table 1, in Example 1, variation in the resistance distribution within the sheet from the initial stage of sputtering to the final stage of sputtering was small (2.6 to 3.2%); that is, variation in the film thickness distribution was small.

As described above, the tantalum target of Example 1 has a high deposition speed, favorable film uniformity, little variation in the film thickness with an 8-inch wafer, and no generation of arcings or particles, and was therefore capable of improving the quality of sputtering deposition.

0.1, respectively. Further, this target had a structure where the sputtered erosion face described later also had a similar orientation.

The average crystal grain size of the target was 60 μm, and, when the target surface was analyzed with EBSP, crystal grains having a crystal grain size of 40 to 120 μm existed in an amount of 100 to 1000 crystal grains/mm$^2$.

Incidentally, since the sheet resistance depends on the film thickness, distribution of the sheet resistance within the wafer (8 inch) was measured, and the status of film thickness distribution was examined thereby.

Specifically, the sheet resistance at 49 points on the wafer was measured, and the standard deviation (σ) was calculated. The results are shown in Table 1.

As evident from Table 1, in Example 2, variation in the resistance distribution within the sheet from the initial stage of sputtering to the final stage of sputtering was small (3.1 to 3.3%); that is, variation in the film thickness distribution was small.

As described above, the tantalum target of Example 2 has a high deposition speed, favorable film uniformity, little variation in the film thickness with an 8-inch wafer, and no generation of arcings or particles, and was therefore capable of improving the quality of sputtering deposition.

TABLE 1

Transition of Film Thickness Distribution in Wafer

|  | Example 1 | Example 2 | Example 3 | Example 4 | Example 5 | Example 6 | Comparative Example 1 | Comparative Example 2 | Comparative Example 3 |
|---|---|---|---|---|---|---|---|---|---|
| Initial Stage of Sputtering | 2.60% | 3.10% | 3.10% | 2.80% | 3.00% | 2.50% | 4.50% | 5.00% | 3.90% |
| Middle Stage of Sputtering | 2.80% | 3.10% | 3.20% | 3.00% | 3.10% | 3.20% | 5.50% | 4.70% | 4.50% |
| Final Stage of Sputtering | 3.20% | 3.30% | 3.40% | 3.20% | 3.30% | 3.30% | 5.50% | 5.30% | 4.50% |

Example 2

A tantalum raw material having a purity of 99.997% was subject to electron beam melting, and this was cast to prepare an ingot or billet having a thickness of 200 mm and diameter of 200 mm φ. The crystal grain diameter in this case was approximately 50 mm.

Next, after performing extend forging to this ingot or billet at room temperature, this was subject to recrystallization annealing at a temperature of 1500K. As a result, a material having a structure in which the average crystal grain diameter is 200 μm, thickness of 100 mm, and diameter of 100 mm φ was obtained.

Next, this was subject to extend forging and upset forging at room temperature once again, and recrystallization annealing was performed thereto again at a temperature of 1173K. As a result, a material having a structure in which the average crystal grain diameter is 80 μm, thickness of 100 mm, and diameter of 100 mm φ was obtained.

Next, this was subject to cold extend forging and upset forging, and recrystallization annealing at 1173K, subsequently subject to cold rolling once again, annealing at 1173K (900° C.) twice as well as finish processing, so as to obtain a target material having a thickness of 10 mm and diameter of 320 mm φ.

As a result of performing the foregoing process, it was possible to obtain a tantalum sputtering target having a random orientation wherein, when the sum of the overall crystalline orientation is 1 on a tantalum target surface, the areas ratio of orientations of (100), (111) and (110) are 0.4, 0.4 and Example 3

A tantalum raw material having a purity of 99.997% was subject to electron beam melting, and this was cast to prepare an ingot or billet having a thickness of 200 mm and diameter of 200 mm φ. The crystal grain diameter in this case was approximately 60 mm.

Next, after performing extend forging to this ingot or billet at room temperature, this was subject to recrystallization annealing at a temperature of 1500K. As a result, a material having a structure in which the average crystal grain diameter is 200 μm, thickness of 100 mm, and diameter of 100 mm φ was obtained.

Next, this was subject to extend forging and upset forging at room temperature once again, and recrystallization annealing was performed thereto again at a temperature of 1173K. As a result, a material having a structure in which the average crystal grain diameter is 80 μm, thickness of 100 mm, and diameter of 100 mm φ was obtained.

Next, this was subject to cold extend forging and upset forging, and recrystallization annealing at 1173K, subsequently subject to cold rolling once again, annealing at 1173K (900° C.), cold rolling, annealing at 1273K (1000° C.) as well as finish processing, so as to obtain a target material having a thickness of 10 mm and diameter of 320 mm φ.

As a result of performing the foregoing process, it was possible to obtain a tantalum sputtering target having a random orientation wherein, when the sum of the overall crystalline orientation is 1 on a tantalum target surface, the areas ratio of orientations of (100), (111) and (110) are 0.3, 0.4 and 0.1, respectively. Further, this target had a structure where the sputtered erosion face described later also had a similar orientation.

The average crystal grain size of the target was 80 μm, and, when the target surface was analyzed with EBSP, crystal grains having a crystal grain size of 50 to 150 μm existed in an amount of 100 to 1000 crystal grains/mm².

Incidentally, since the sheet resistance depends on the film thickness, distribution of the sheet resistance within the wafer (8 inch) was measured, and the status of film thickness distribution was examined thereby.

Specifically, the sheet resistance at 49 points on the wafer was measured, and the standard deviation (σ) was calculated. The results are shown in Table 1.

As evident from Table 1, in Example 3, variation in the resistance distribution within the sheet from the initial stage of sputtering to the final stage of sputtering was small (3.1 to 3.4%); that is, variation in the film thickness distribution was small.

As described above, the tantalum target of Example 3 has a high deposition speed, favorable film uniformity, little variation in the film thickness with an 8-inch wafer, and no generation of arcings or particles, and was therefore capable of improving the quality of sputtering deposition.

Example 4

A tantalum raw material having a purity of 99.997% was subject to electron beam melting, and this was cast to prepare an ingot or billet having a thickness of 200 mm and diameter of 200 mm φ. The crystal grain diameter in this case was approximately 55 mm.

Next, after performing extend forging to this ingot or billet at room temperature, this was subject to recrystallization annealing at a temperature of 1500K. As a result, a material having a structure in which the average crystal grain diameter is 200 μm, thickness of 100 mm, and diameter of 100 mm φ was obtained.

Next, this was subject to extend forging and upset forging at room temperature once again, and recrystallization annealing was performed thereto again at a temperature of 1480K. As a result, a material having a structure in which the average crystal grain diameter is 100 μm, thickness of 100 mm, and diameter of 100 mm φ was obtained.

Next, this was subject to cold extend forging and upset forging, and recrystallization annealing at 1173K, subsequently subject to cold rolling once again, and annealing at 1173K (900° C.) thereafter as well as finish processing, so as to obtain a target material having a thickness of 10 mm and diameter of 320 mm φ.

As a result of performing the foregoing process, it was possible to obtain a tantalum sputtering target having a random orientation wherein, when the sum of the overall crystalline orientation is 1 on a tantalum target surface, the ratio areas of a crystal having the orientations of (100)<001>, (111)<001> and (110)<001>, and in which the rotation error is within 10° against an ND axis (orientation axis normal to rolling plane) are 0.3, 0.3 and 0.1, respectively. Further, this target had a structure where the sputtered erosion face described later also had a similar orientation.

The average crystal grain size of the target was 35 μm, and, when the target surface was analyzed with EBSP, crystal grains having a crystal grain size of 30 to 100 μm existed in an amount of 100 to 1000 crystal grains/mm².

Incidentally, since the sheet resistance depends on the film thickness, distribution of the sheet resistance within the wafer (8 inch) was measured, and the status of film thickness distribution was examined thereby.

Specifically, the sheet resistance at 49 points on the wafer was measured, and the standard deviation (σ) was calculated. The results are shown in Table 1.

As evident from Table 1, in Example 4, variation in the resistance distribution within the sheet from the initial stage of sputtering to the final stage of sputtering was small (2.8 to 3.2%); that is, variation in the film thickness distribution was small.

As described above, the tantalum target of Example 4 has a high deposition speed, favorable film uniformity, little variation in the film thickness with an 8-inch wafer, and no generation of arcings or particles, and was therefore capable of improving the quality of sputtering deposition.

Example 5

A tantalum raw material having a purity of 99.997% was subject to electron beam melting, and this was cast to prepare an ingot or billet having a thickness of 200 mm and diameter of 200 mm φ. The crystal grain diameter in this case was approximately 55 mm.

Next, after performing extend forging to this ingot or billet at room temperature, this was subject to recrystallization annealing at a temperature of 1500K. As a result, a material having a structure in which the average crystal grain diameter is 200 μm, thickness of 100 mm, and diameter of 100 mm φ was obtained.

Next, this was subject to extend forging and upset forging at room temperature once again, and recrystallization annealing was performed thereto again at a temperature of 1173K. As a result, a material having a structure in which the average crystal grain diameter is 80 μm, thickness of 100 mm, and diameter of 100 mm φ was obtained.

Next, this was subject to cold extend forging and upset forging, and recrystallization annealing at 1173K, subsequently subject to cold rolling and annealing at 1173K (900° C.) that were performed twice, and finish processing was performed so as to obtain a target material having a thickness of 10 mm and diameter of 320 mm φ.

As a result of performing the foregoing process, it was possible to obtain a tantalum sputtering target having a random orientation wherein, when the sum of the overall crystalline orientation is 1 on a tantalum target surface, the area ratio of crystals having the orientations of (100)<001>, (111)<001>, (110)<001>, and in which the rotation error is within 10° against an ND axis (orientation axis normal to rolling plane) are 0.5, 0.2 and 0.1, respectively. Further, this target had a structure where the sputtered erosion face described later also had a similar orientation.

The average crystal grain size of the target was 60 μm, and, when the target surface was analyzed with EBSP, crystal grains having a crystal grain size of 40 to 120 μm existed in an amount of 100 to 1000 crystal grains/mm².

Incidentally, since the sheet resistance depends on the film thickness, distribution of the sheet resistance within the wafer (8 inch) was measured, and the status of film thickness distribution was examined thereby.

Specifically, the sheet resistance at 49 points on the wafer was measured, and the standard deviation (σ) was calculated. The results are shown in Table 1.

As evident from Table 1, in Example 5, variation in the resistance distribution within the sheet from the initial stage of sputtering to the final stage of sputtering was small (3.0 to 3.3%); that is, variation in the film thickness distribution was small.

As described above, the tantalum target of Example 5 has a high deposition speed, favorable film uniformity, little variation in the film thickness with an 8-inch wafer, and no generation of arcings or particles, and was therefore capable of improving the quality of sputtering deposition.

Example 6

A tantalum raw material having a purity of 99.997% was subject to electron beam melting, and this was cast to prepare an ingot or billet having a thickness of 200 mm and diameter of 200 mm φ. The crystal grain diameter in this case was approximately 50 mm.

Next, after performing extend forging to this ingot or billet at room temperature, this was subject to recrystallization annealing at a temperature of 1500K. As a result, a material having a structure in which the average crystal grain diameter is 200 μm, thickness of 100 mm, and diameter of 100 mm φ was obtained.

Next, this was subject to extend forging and upset forging at room temperature once again, and recrystallization annealing was performed thereto again at a temperature of 1173K. As a result, a material having a structure in which the average crystal grain diameter is 80 μm, thickness of 100 mm, and diameter of 100 mm φ was obtained.

Next, this was subject to cold extend forging and upset forging, and recrystallization annealing at 1173K, subsequently subject to cold rolling once again, annealing at 1173K (900° C.), cold rolling, annealing at 1273K (1000° C.) as well as finish processing, so as to obtain a target material having a thickness of 1 mm and diameter of 320 mm φ.

As a result of performing the foregoing process, it was possible to obtain a tantalum sputtering target having a random orientation wherein, when the sum of the overall crystalline orientation is 1 on a tantalum target surface, the area ratio of crystals having the orientations of (100)<001>, (111)<001>, (110)<001>, and in which the rotation error is within 10° against an ND axis (orientation axis normal to rolling plane) are 0.2, 0.4 and 0.1, respectively. Further, this target had a structure where the sputtered erosion face described later also had a similar orientation.

The average crystal grain size of the target was 80 μm, and, when the target surface was analyzed with EBSP, crystal grains having a crystal grain size of 50 to 150 μm existed in an amount of 100 to 1000 crystal grains/mm$^2$.

Incidentally, since the sheet resistance depends on the film thickness, distribution of the sheet resistance within the wafer (8 inch) was measured, and the status of film thickness distribution was examined thereby.

Specifically, the sheet resistance at 49 points on the wafer was measured, and the standard deviation (σ) was calculated. The results are shown in Table 1.

As evident from Table 1, in Example 6, variation in the resistance distribution within the sheet from the initial stage of sputtering to the final stage of sputtering was small (2.5 to 3.3%); that is, variation in the film thickness distribution was small.

As described above, the tantalum target of Example 6 has a high deposition speed, favorable film uniformity, little variation in the film thickness with an 8-inch wafer, and no generation of arcings or particles, and was therefore capable of improving the quality of sputtering deposition.

Comparative Example 1

As with Example 1, a tantalum raw material having a purity of 99.997% was subject to electron beam melting, and this was cast to prepare an ingot or billet having a thickness of 200 mm and diameter of 200 mm φ. The crystal grain diameter in this case was approximately 55 mm. Next, after performing extend forging and upset forging to this ingot or billet at room temperature, this was subject to recrystallization annealing at a temperature of 1173K. As a result, a material having a structure in which the average crystal grain diameter is 180 μm, thickness of 100 mm, and diameter of 100 mm φ was obtained.

Next, this was subject to extend forging and upset forging at room temperature once again, and recrystallization annealing was performed thereto again at a temperature of 1173K. As a result, a material having a structure in which the average crystal grain diameter is 80 μm, thickness of 100 mm, and diameter of 100 mm φ was obtained.

Next, this was subject to cold rolling and recrystallization annealing at 1173K, as well as finish processing, so as to obtain a target material having a thickness of 10 mm and diameter of 320 mm φ.

The tantalum target obtained with the foregoing process had an average crystal grain size of 55 μm, and there were variations in certain locations. It was possible to obtain a tantalum sputtering target having a uniform orientation wherein, when the sum of the overall crystalline orientation is 1 on a tantalum target surface, the areas ratio of orientations of (100), (111) and (110) are 0.8, 0.2 and 0, respectively.

When performing sputtering with this tantalum target, evenness (uniformity) of the film was inferior, and caused the quality of sputter deposition to deteriorate. The results are similarly shown in Table 1.

The results shown in Comparative Example 1 of Table 1 were obtained by measuring the sheet resistance at 49 points on the wafer (8 inch) as with Example 1, and calculating the standard deviation (σ) thereof. In Comparative Example 1, variation in the resistance distribution within the sheet from the initial stage of sputtering to the final stage of sputtering was large (4.5 to 5.5%); that is, variation in the film thickness distribution was significant.

Further, variation in the film thickness in an 8-inch wafer was significant, arcings and particles were generated, and this caused the quality of the sputtering deposition to deteriorate.

Comparative Example 2

As with Example 1, a tantalum raw material having a purity of 99.997% was subject to electron beam melting, and this was cast to prepare an ingot or billet having a thickness of 200 mm and diameter of 200 mm φ. The crystal grain diameter in this case was approximately 55 mm. Next, after performing cold mix forging to this ingot or billet at room temperature, this was subject to recrystallization annealing at a temperature of 1173K. As a result, a material having a structure in which the average crystal grain diameter is 180 μm, thickness of 100 mm, and diameter of 100 mm φ was obtained.

Next, this was subject to extend forging and upset forging at room temperature once again, and recrystallization annealing was performed thereto again at a temperature of 1173K. As a result, a material having a structure in which the average crystal grain diameter is 80 μm, thickness of 100 mm, and diameter of 100 mm φ was obtained.

Next, this was subject to cold rolling and recrystallization annealing at 1373K, as well as finish processing, so as to obtain a target material having a thickness of 10 mm and diameter of 320 mm φ.

The tantalum target obtained with the foregoing process had coarsened crystals.

The tantalum target obtained with the foregoing process had an average crystal grain size of 96 μm, and there were variations. It was possible to obtain a tantalum sputtering target having a uniform orientation wherein, when the sum of the overall crystalline orientation is 1 on a tantalum target surface, the areas ratio of orientations of (100), (111) and (110) are 0.2, 0.7 and 0.1, respectively.

When performing sputtering with this tantalum target, evenness (uniformity) of the film was inferior, and caused the quality of sputter deposition to deteriorate. The results are similarly shown in Table 1.

The results shown in Comparative Example 2 of Table 1 were obtained by measuring the sheet resistance at 49 points on the wafer (8 inch) as with Example 1, and calculating the standard deviation (σ) thereof. In Comparative Example 2, variation in the resistance distribution within the sheet from the initial stage of sputtering to the final stage of sputtering was large (4.7 to 5.3%); that is, variation in the film thickness distribution was significant.

Further, with this tantalum target, evenness (uniformity) of the film was inferior, variation in the film thickness in an 8-inch wafer was significant, arcings and particles were generated, and this caused the quality of the sputtering deposition to deteriorate.

Comparative Example 3

As with Example 1, a tantalum raw material having a purity of 99.997% was subject to electron beam melting, and this was cast to prepare an ingot or billet having a thickness of 200 mm and diameter of 200 mm φ. The crystal grain diameter in this case was approximately 55 mm. Next, after performing cold mix forging to this ingot or billet at room temperature, this was subject to recrystallization annealing at a temperature of 1173K. As a result, a material having a structure in which the average crystal grain diameter is 180 μm, thickness of 100 mm, and diameter of 100 mm φ was obtained.

Next, this was subject to extend forging and upset forging at room temperature once again, and recrystallization annealing was performed thereto again at a temperature of 1173K. As a result, a material having a structure in which the average crystal grain diameter is 80 μm, thickness of 100 mm, and diameter of 100 mm φ was obtained.

Next, this was subject to cold rolling and recrystallization annealing at 1123K, as well as finish processing, so as to obtain a target material having a thickness of 10 mm and diameter of 320 mm φ.

The tantalum target obtained with the foregoing process had an average crystal grain size of 37 μm, and there were variations. It was possible to obtain a tantalum sputtering target having a uniform orientation wherein, when the sum of the overall crystalline orientation is 1 on a tantalum target surface, the area ratio of crystals having the orientations of (100)<001>, (111)<001>, (110)<001>, and in which the rotation error is within 10° against an ND axis (orientation axis normal to rolling plane) are 0.7, 0.2 and 0.1, respectively. This tantalum target had a generally aligned orientation from the target surface toward the center part thereof.

When performing sputtering with this tantalum target, evenness (uniformity) of the film was inferior, and caused the quality of sputter deposition to deteriorate. The results are similarly shown in Table 1.

The results shown in Comparative Example 3 of Table 1 were obtained by measuring the sheet resistance at 49 points on the wafer (8 inch) as with Example 1, and calculating the standard deviation (σ) thereof. In Comparative Example 3, variation in the resistance distribution within the sheet from the initial stage of sputtering to the final stage of sputtering was large (3.9 to 4.5%); that is, variation in the film thickness distribution was significant.

Further, with this tantalum target, evenness (uniformity) of the film was inferior, variation in the film thickness in an 8-inch wafer was significant, arcings and particles were generated, and this caused the quality of the sputtering deposition to deteriorate.

The present invention is not a target where the coarse crystals or crystal orientation according to conventional recrystallization annealing are arranged in a specific orientation, but is a tantalum target having a random orientation, and, therefore, this can be applied to a tantalum sputtering target being demanded to be a high deposition speed, superior film evenness (uniformity), reduced generation of arcings or particles and favorable target use efficiency.

The invention claimed is:

1. A sputtering target, comprising a tantalum sputtering target having a recrystallized grain structure formed by forging, rolling and heat treatment processing of a cast ingot such that said recrystallized grain structure has fine and uniform crystal grains, and said target having a random crystal orientation, wherein, when a sum of an overall crystalline orientation of a surface of said tantalum sputtering target is made to be 1, an area ratio of crystals having any orientation among (100), (111) and (110) does not exceed 0.5, and the area ratio of crystals having the orientation of (100) is 0.3 to 0.5.

2. The tantalum sputtering target according to claim 1, wherein when the sum of the overall crystalline orientation of said surface of said tantalum sputtering target is 1, a sum of the area ratio of crystals having any two orientations among (100), (111) and (110) does not exceed 0.75.

3. A tantalum sputtering target according to claim 2, wherein said surface is a sputtered erosion face of said tantalum sputtering target.

4. A tantalum sputtering target according to claim 3, wherein an average crystal grain size of said tantalum sputtering target is 80 μm or less.

5. A tantalum sputtering target according to claim 1, wherein said surface is a sputtered erosion face of said tantalum sputtering target.

6. A tantalum sputtering target according to claim 1, wherein an average crystal grain size of said tantalum sputtering target is 80 μm or less.

7. A tantalum sputtering target according to claim 1, wherein a purity of said tantalum sputtering target is 99.99% or more.

8. A tantalum sputtering target according to claim 1, wherein the area ratio of crystals having the orientation of (100) is 0.4 to 0.5.

9. A sputtering target, comprising a tantalum sputtering target having a recrystallized grain structure formed by forging, rolling and heat treatment processing of a cast ingot such that said recrystallized grain structure has fine and uniform crystal grains, and said target having a random crystal orientation, wherein, when a sum of an overall crystalline orientation of a surface of said tantalum sputtering target is made to be 1, a sum of an area ratio of crystals having any two orientations among (100), (111) and (110) does not exceed 0.75, and an area ratio of crystals having an orientation of (100) is 0.3 to 0.5.

10. A tantalum sputtering target according to claim 9, wherein the area ratio of crystals having the orientation of (100) is 0.4 to 0.5.

11. A sputtering target, comprising a tantalum sputtering target having a recrystallized grain structure formed by forging, rolling and heat treatment processing of a cast ingot such that said recrystallized grain structure has fine and uniform crystal grains, and said target having a random crystal orientation, wherein, when a sum of an overall crystalline orientation of a surface of said tantalum sputtering target is made to be 1, an area ratio of crystals having any orientation among (100)<001>, (111)<001> and (110)<001> of which is angular errors from an ND direction are within 10° does not exceed 0.5, and the area ratio of crystals having the orientation of (100)<001> of which angular errors from the ND direction are within 10° is 0.3 to 0.5.

12. A tantalum sputtering target according to claim 11, wherein, when the sum of the overall crystalline orientation is 1 on said surface, the sum of the area ratio of crystals having any two orientations among (100)<001>, (111)<001> and (110)<001> of which angular errors from the ND direction are within 10° does not exceed 0.75.

13. A tantalum sputtering target according to claim 11, wherein said surface is a sputtered erosion face of said tantalum sputtering target.

14. A tantalum sputtering target according to claim 11, wherein an area ratio of crystals having the orientation of (111)<001> of which angular errors from the ND direction are within 10° is 0.2 to 0.3.

15. A sputtering target, comprising a tantalum sputtering target having a recrystallized grain structure formed by forging, rolling and heat treatment processing of a cast ingot such that said recrystallized grain structure has fine and uniform crystal grains, and said target having a random crystal orientation, wherein, when a sum of an overall crystalline orientation of a surface of said tantalum sputtering target is made to be 1, a sum of the area ratio of crystals having any two orientations among (100)<001>, (111)<001> and (110)<001> of which angular errors from an ND direction are within 10° does not exceed 0.75, and an area ratio of crystals having an orientation of (100)<001> of which angular errors from the ND direction are within 10° is 0.3 to 0.5.

16. A tantalum sputtering target according to claim 15, wherein an area ratio of crystals having the orientation of (111)<001> of which angular errors from the ND direction are within 10° is 0.2 to 0.3.

* * * * *

UNITED STATES PATENT AND TRADEMARK OFFICE
CERTIFICATE OF CORRECTION

PATENT NO.         : 7,892,367 B2
APPLICATION NO.    : 10/572252
DATED              : February 22, 2011
INVENTOR(S)        : Kunihiro Oda It is certified that error appears in the above-identified patent and that said Letters Patent is hereby corrected as shown below:

Column 11, line 31 -- thickness of 1 mm -- should read -- thickness of 10 mm --

Signed and Sealed this
Twenty-sixth Day of April, 2011

David J. Kappos
*Director of the United States Patent and Trademark Office*